(12) United States Patent
Chang et al.

(10) Patent No.: US 7,286,011 B2
(45) Date of Patent: Oct. 23, 2007

(54) OPERATIONAL AMPLIFIER CIRCUIT HAVING ADJUSTABLE BIAS CURRENT

(75) Inventors: Yu-Jui Chang, Tainan County (TW); Ying-Lieh Chen, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 206 days.

(21) Appl. No.: 11/160,039

(22) Filed: Jun. 7, 2005

(65) Prior Publication Data

US 2006/0273849 A1   Dec. 7, 2006

(51) Int. Cl.
*H03F 1/14* (2006.01)
(52) U.S. Cl. ........................................ 330/51
(58) Field of Classification Search .................. 330/51, 330/69
See application file for complete search history.

(56) References Cited

U.S. PATENT DOCUMENTS 6,710,617 B2   3/2004   Humphrey .................. 326/30
7,154,331 B2 *  12/2006   Zaguri ........................ 330/254

FOREIGN PATENT DOCUMENTS

TW              496990          8/2002

OTHER PUBLICATIONS

"FETs As Voltage-Controlled Resistors" Siliconix AN105 Mar. 10, 1997 pp. 1-6.*

* cited by examiner

*Primary Examiner*—Steven J. Mottola
(74) *Attorney, Agent, or Firm*—Winston Hsu

(57) ABSTRACT

An operational amplifier circuit includes an operational amplifier, a bias current provider, and a control circuitry. The operational amplifier drives a load according to an input signal. The bias current provider is coupled to the operational amplifier and provides a bias current to the operational amplifier. The control circuitry is coupled to the bias current provider and controls the bias current provider to adjust the bias current according to an operating status of the operational amplifier circuit.

9 Claims, 1 Drawing Sheet

OPERATIONAL AMPLIFIER CIRCUIT HAVING ADJUSTABLE BIAS CURRENT

BACKGROUND OF THE INVENTION

1. Field of the Invention

The present invention relates to an operational amplifier (op amp), and more particularly, to an operational amplifier circuit having an adjustable bias current.

2. Description of the Prior Art

The operational amplifier (op amp) is an essential circuit building block of universal importance. A reason for the popularity of the op amp is its versatility; a great amount of operations can be done with op amps. Normally, an operational amplifier circuit is used to drive a load according to an analog input signal. However, if a digital input signal is adopted, a digital-to-analog converter (DAC) must be set in the signal input end of the operational amplifier circuit to convert the digital input signal into an analog input signal. The operational amplifier circuit can then drive the load according to the analog input signal. For instance, the liquid crystal display (LCD) source driver is a kind of device that needs to utilize an operational amplifier circuit including a DAC to drive a LCD display unit according to a digital input signal.

In a conventional operational amplifier circuit, some transistors are set as bias current providers for providing bias currents. The control terminals of these transistors are coupled to constant bias voltages; hence the bias currents provided by these transistors have fixed values.

After a conventional operational amplifier circuit is properly installed and supply voltages are provided to the operational amplifier circuit, power will be continually consumed by bias current providers of the operational amplifier circuit. In practice, an operational amplifier circuit is not always under operation, even if supply voltages are provided to the operational amplifier circuit properly. For example, if no signal is inputted into the operational amplifier circuit, the operational amplifier circuit will not be under operation, and no driving operation will be performed by the operational amplifier circuit. However, when the operational amplifier circuit is not under operation, power is still continually consumed by the transistors for providing constant bias currents. In other words, some power will be wasted unnecessarily.

SUMMARY OF THE INVENTION

It is an objective of the claimed invention to provide an operational amplifier circuit having an adjustable bias current.

According to the claimed invention, an operational amplifier circuit is disclosed. The operational amplifier circuit comprises an operational amplifier for driving a load according to an input signal, a bias current provider coupled to the operational amplifier for providing a bias current to the operational amplifier, and a control circuitry coupled to the bias current provider for controlling the bias current provider to adjust the bias current according to an operating status of the operational amplifier circuit.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
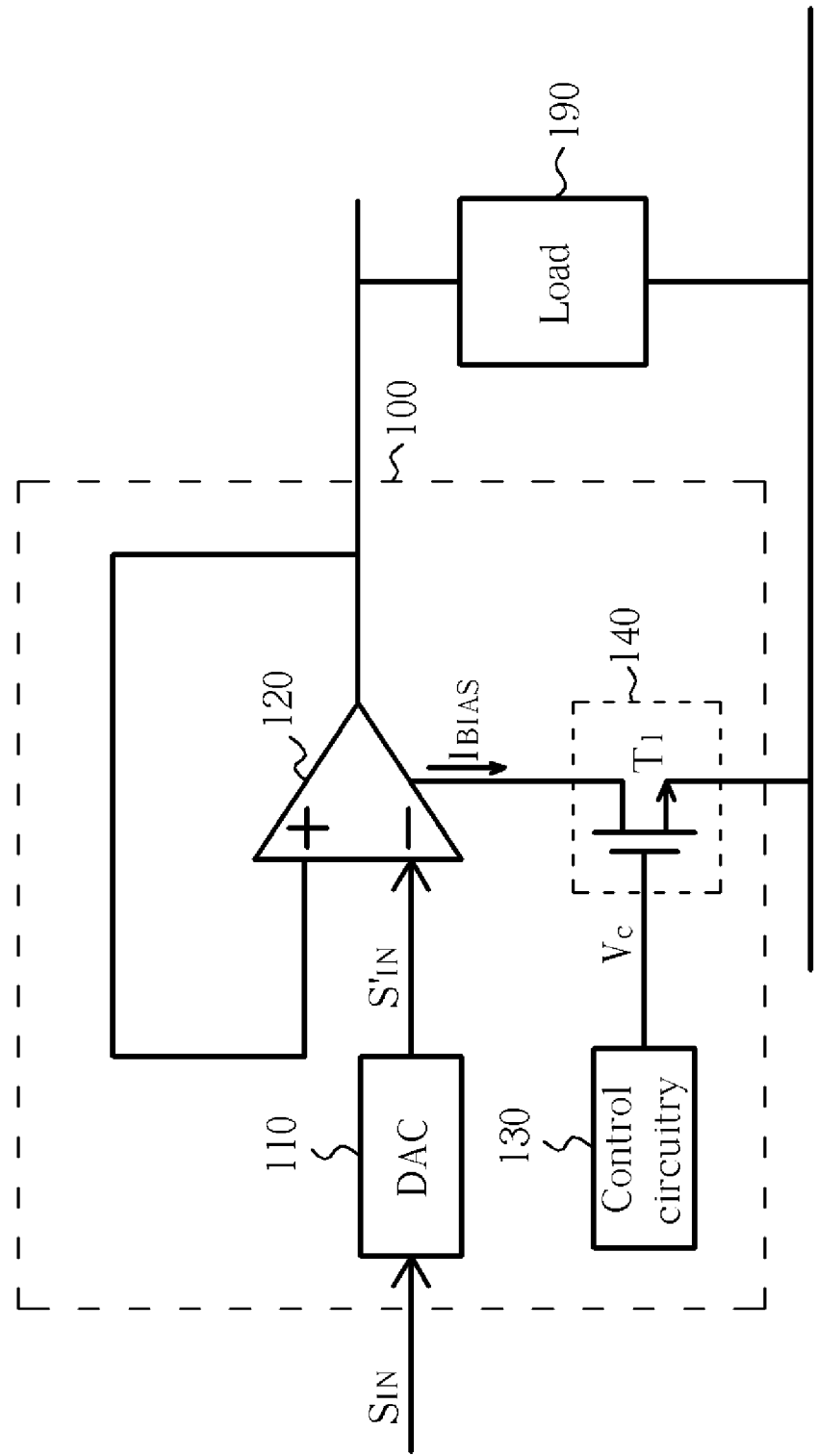
FIG. 1 shows a schematic diagram of an operational amplifier circuit according to the present invention.

Please refer to FIG. 1, which shows an operational amplifier circuit 100 according to an exemplary embodiment of the present invention. In this embodiment, the operational amplifier circuit 100 is set inside a LCD source driver for driving a LCD display unit according to a digital input signal $S_{IN}$. The LCD display unit is represent by a block "load 190" in FIG. 1. In other embodiments, however, the operational amplifier circuit of the present invention can also be set in other kind of device for driving a load according to a digital input signal or an analog input signal.

The operational amplifier circuit 200 shown in FIG. 1 comprises a digital-to-analog converter (DAC) 110, an op amp 120, a control circuitry 130, and a bias current provider 140. The DAC 110 converts an input signal $S_{IN}$ into an analog signal $S'_{IN}$ and inputs the analog signal $S'_{IN}$ into the op amp 120. The op amp 120 drives the load 190 according to the analog signal $S'_{IN}$. The bias current provider 140 provides a bias current $I_{BIAS}$ to the op amp 120. In practice, one or more than one transistor can be included in the bias current provider 140 for providing bias current(s) required by the op amp 120; however, for simplicity, only one transistor $T_1$ and one bias current $I_{BIAS}$ provided by the transistor $T_1$ is shown in this figure. The transistor $T_1$ has a control terminal coupled to the control circuitry 130, a first terminal coupled to a bias voltage, and a second terminal coupled to the operational amplifier 120 for providing the bias current $I_{BIAS}$ to the operational amplifier 120. The control circuitry 130 in this embodiment controls a voltage level at the control terminal of the transistor $T_1$ to adjust the bias current $I_{BIAS}$.

Rather than having a control terminal coupled to a fixed bias voltage, the control terminal of the transistor $T_1$ is coupled to the control circuitry 130 for receiving a control signal $V_C$. The control circuitry 130 generates the control signal $V_C$ according to an operating status of the operational amplifier circuit 100, therefore the bias current $I_{BIAS}$ is adjusted according to the operating status of the operational amplifier circuit 100.

More specifically, in this embodiment, when the operational amplifier circuit 100 is under operation (for example, when digital codes are inputted into the DAC 110 as the digital input signal $S_{IN}$), the control circuitry 130 utilizes the control signal $V_C$ to control the bias current provider 140 to adjust the bias current $I_{BIAS}$ to a high value. When the operational amplifier circuit 100 is not under operation (for example, when no digital code is inputted into the DAC 110 as the digital input signal $S_{IN}$), the control circuitry 130 utilizes the control signal $V_C$ to adjust the bias current provider 140 to a low value or turn off the transistor $T_1$. Apparently, by using the control circuitry 130 to control the bias current provider 140 to adjust the value of the bias current $I_{BIAS}$ according to the operating status of the operational amplifier circuit 100, unnecessary power consumption will be reduced.

In addition, when the operational amplifier circuit 100 is under operation, the control circuitry 130 can further utilize the control signal $V_C$ to control the bias current provider 140 to adjust the bias current $I_{BIAS}$ according to a required driving ability of the operational amplifier circuit 100.

Herein the "driving ability" of an operational amplifier circuit can refer to charging current and discharging current providing ability of the operational amplifier circuit. The "driving ability" of the operational amplifier circuit can also refer to load charging and discharging speed of the operational amplifier circuit. If a load corresponding to a large equivalent capacitance is going to be driven, a high driving ability will be required by the operational amplifier circuit to drive the load. If a load corresponding to a small equivalent capacitance is going to be driven, a low driving ability will be enough for the operational amplifier circuit to drive the load.

Generally speaking, the driving ability of an operational amplifier circuit can be determined by the level of bias current(s) utilized by the operational amplifier circuit. The larger the bias current(s) is utilized, the higher the driving ability the operational amplifier circuit has. The smaller the bias current(s) is utilized, the lower the driving ability the operational amplifier circuit has. Hence, in the embodiment shown in FIG. 1, when a high driving ability is required, the control circuitry 130 utilizes the control signal $V_C$ to control the bias current provider 140 to raise the value of the bias current $I_{BIAS}$. When a low driving ability is required, the control circuitry 130 utilizes the control signal $V_C$ to control the bias current provider 140 to abate the value of the bias current $I_{BIAS}$. Therefore, when the operational amplifier circuit 100 of this embodiment is under operation, it can have a dynamically adjustable driving ability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier circuit comprising:
   an operational amplifier for driving a load according to an input signal;
   a bias current provider coupled to the operational amplifier for providing a bias current to the operational amplifier; and
   a control circuitry coupled to the bias current provider, for controlling the bias current provider to adjust the bias current according to an operating status of the operational amplifier circuit, wherein the control circuitry controls the bias current provider to adjust the bias current to a low value when the operational amplifier circuit is not under operation, and controls the bias current provider to adjust the bias current to a high value when the operational amplifier circuit is under operation.

2. The operational amplifier circuit of claim 1, wherein the control circuitry controls the bias current provider to adjust the bias current to a low value when a low driving ability is required for driving the load, and controls the bias current provider to adjust the bias current to a high value when a high driving ability is required for driving the load.

3. The operational amplifier circuit of claim 1, wherein the bias current provider comprises a transistor having a control terminal coupled to the control circuitry, a first terminal coupled to a bias voltage, and a second terminal coupled to the operational amplifier for providing the bias current to the operational amplifier; and the control circuitry controls a voltage level at the control terminal to adjust the bias current.

4. The operational amplifier circuit of claim 1, wherein the input signal is a digital input signal, the operational amplifier circuit further comprises a digital to analog converter (DAC) coupled to the operational amplifier for converting the digital input signal into an analog input signal, and the operational amplifier drives the load according to the analog input signal received from the DAC.

5. The operational amplifier circuit of claim 1, wherein the operational amplifier circuit is set inside a liquid crystal display (LCD) source driver for driving the load according to the input signal, and the load is a LCD display unit.

6. A display driving circuit comprising:
   a digital to analog converter (DAC), for converting a digital input signal into an analog input signal;
   an operational amplifier, coupled to the DAC, for driving a display unit according to the analog input signal;
   a bias current provider, coupled to the operational amplifier, for providing a bias current to the operational amplifier; and
   a control circuitry, coupled to the bias current provider, for controlling the bias current provider to adjust the bias current according to an operating status of the operational amplifier circuit.

7. The display driving circuit of claim 6, wherein the control circuitry controls the bias current provider to adjust the bias current to a low value when the display unit corresponds to a first load value, and controls the bias current provider to adjust the bias current to a high value when the display unit corresponds to a second load value greater than the first load value.

8. The display driving circuit of claim 6, wherein the operational amplifier has a fixed closed loop gain.

9. The display driving circuit of claim 8, wherein the fixed closed loop gain is equal to one.

* * * * *